US006532403B2

(12) United States Patent
Beckhart et al.

(10) Patent No.: US 6,532,403 B2
(45) Date of Patent: Mar. 11, 2003

(54) ROBOT ALIGNMENT SYSTEM AND METHOD

(75) Inventors: Gordon Haggott Beckhart, Colorado Springs, CO (US); Patrick Rooney Conarro, Green Mountain Falls, CO (US); Kevin James Harrell, Woodland Park, CO (US); Michael Charles Krause, Colorado Springs, CO (US); Kamran Michael Farivar-Sadri, Colorado Springs, CO (US)

(73) Assignee: MicroTool, Inc, Colorado Springs, CO (US)

( * ) Notice: Subject to any disclaimer, the term of this patent is extended or adjusted under 35 U.S.C. 154(b) by 1 day.

(21) Appl. No.: 09/837,878

(22) Filed: Apr. 18, 2001

(65) Prior Publication Data

US 2002/0016650 A1 Feb. 7, 2002

Related U.S. Application Data

(60) Provisional application No. 60/199,404, filed on Apr. 21, 2000.

(51) Int. Cl.$^7$ .......................... G05B 19/04; G05B 19/18
(52) U.S. Cl. .................. 700/254; 700/214; 700/218; 700/186; 700/245; 700/252; 700/258; 318/567; 318/568.13; 318/568.14; 318/574; 901/2; 901/4; 901/15; 414/416.03
(58) Field of Search ................... 700/258, 245, 700/218, 252, 186, 213, 204; 318/568.13, 568.14, 567, 574; 414/400, 416.03, 416.08, 217, 225.01, 226.05, 222.13, 936, 937, 941, 744.5, 744.6, 749.1, 800; 901/2, 6, 15, 46; 118/500, 728

(56) References Cited

U.S. PATENT DOCUMENTS

| | | | | |
|---|---|---|---|---|
| 5,004,399 A | * | 4/1991 | Sullivan et al. | 318/568.17 |
| 5,409,348 A | * | 4/1995 | Suzuki | 318/568.12 |
| 5,456,561 A | * | 10/1995 | Poduje et al. | 318/568.12 |
| 5,645,391 A | * | 7/1997 | Ohsawa et al. | 318/568.12 |
| 5,711,646 A | * | 1/1998 | Ueda et al. | 318/568.2 |
| 5,730,574 A | * | 3/1998 | Adachi et al. | 318/567 |
| 5,789,890 A | * | 8/1998 | Genov | 700/56 |
| 5,810,935 A | * | 9/1998 | Lee et al. | 700/245 |
| 5,822,498 A | * | 10/1998 | Kumasaka et al. | 700/253 |
| 6,085,125 A | * | 7/2000 | Genov et al. | 700/218 |
| 6,300,644 B1 | * | 10/2001 | Beckhart et al. | 250/559.33 |

OTHER PUBLICATIONS

Connell, SSS: A hybrid architecture applied to robot navigation, 1992, Internet, pp. 1–6.*
Easy–Laser D510, Vibration, alignment, balancing, & more, no date, Internet, pp. 1–2.*
Ghidary et al., Multi–modal human robot interaction for map generation, no date, Internet, pp. 1–6.*

* cited by examiner

*Primary Examiner*—William A. Cuchlinski, Jr.
*Assistant Examiner*—McDieunel Marc
(74) *Attorney, Agent, or Firm*—Law Offices of Dale B. Halling, LLC

(57) ABSTRACT

A robot alignment system (10) includes a sensor system (12). The sensor system (12) is designed to attach to an end effector of a robot arm (14). A rough alignment target (16) is attached to a work station. A fine alignment target (22) is placed on a work surface of the work station. The sensor system (12) first determines the rough alignment target (16). The robot arm (14) is then moved to detect the fine alignment target (22).

19 Claims, 2 Drawing Sheets

ROBOT ALIGNMENT SYSTEM AND METHOD

This application claims the benefit of Provisional application No. 60/199,404, filed Apr. 21, 2000.

FIELD OF THE INVENTION

The present invention relates generally to the field of robots and more particularly to a robot alignment system and method.

BACKGROUND OF THE INVENTION

Semiconductor wafers are moved into and out of cassettes by automated handling devices (robots) as part of the semiconductor manufacturing process. The cassettes hold the wafers while other wafers are being processed. The robots require a setup procedure to properly pick up wafers and to properly set wafers into position. The setup procedure typically involves visually determining robot positions and recording these coordinates. A number of problems can occur when robots and platforms are not properly setup. In the most severe case the robots can break wafers. Less severe misalignments can lead to wafer scratching and yield loss. The most common misalignment leads to wafers bumping into the cassette walls and scraping off particles.

Visual or eyeball alignment does not align to a standard. In addition, eyeball alignments cannot address issues related to platform level, robot end effector level, or a dynamic path that the end effector may follow. Finally, eyeball alignments are difficult, time consuming, and inaccurate.

Thus there exists a need for a device that provides a standard robot setup procedure, is fast, easy, accurate and can address issues such as dynamic path concerns.

DETAILED DESCRIPTION OF THE DRAWINGS

A robot alignment system includes a sensor system. The sensor system is designed to attach to an end effector of a robot arm. A rough alignment target is attached to a work station. A fine alignment target is placed on a work surface of the work station. The sensor system first determines the rough alignment target. The robot arm is then moved to detect the fine alignment target. This system allows the robot arm's motion to be precisely calibrated which significantly reduces the defects to semiconductor wafers.

Figure 1:
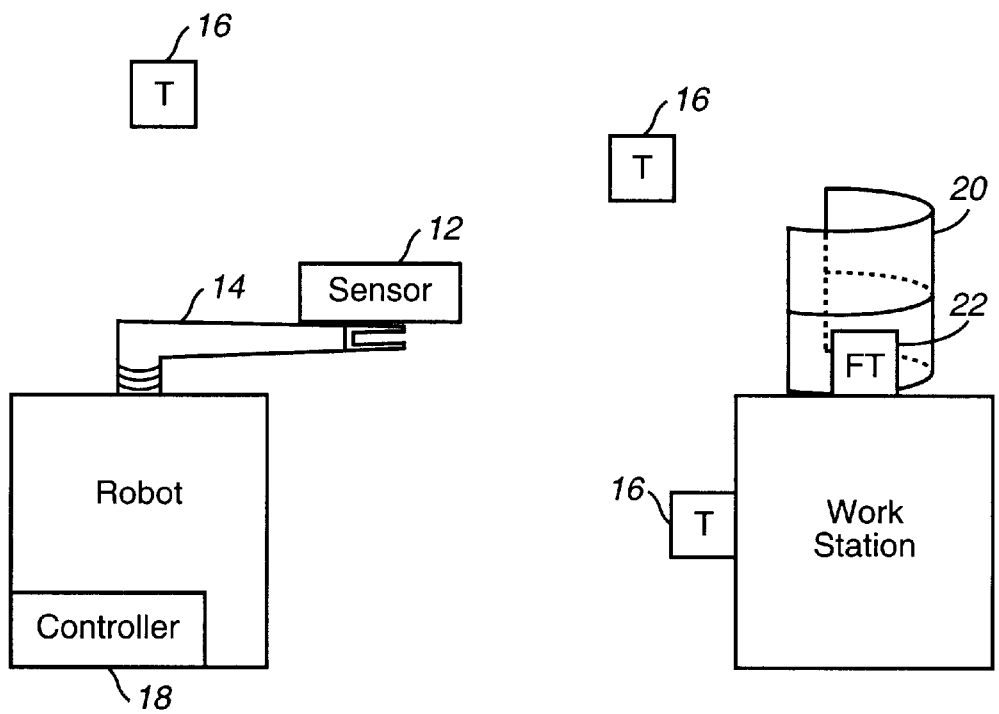
FIG. 1 is a cartoon drawing of a robot alignment system in accordance with one embodiment of the invention.

FIG. 1 is a cartoon drawing of a robot alignment system 10 in accordance with one embodiment of the invention. The system 10 includes a sensor system 12 that is designed to attach to a robot arm end effector 14. The robot arm 14 scans an area so the sensor system can detect a rough alignment target 16. The rough alignment targets are attached to a work station 16. When a rough alignment target 16 is detected, the information is passed to a robot controller 18. This information can be as simple as a message that a rough alignment target 16 has been detected. The robot control 18 then records the angle and the height when the message was received. In another embodiment, the sensor system 12 determines the rough angle and the rough height of the target 16. This information is then communicated with the robot controller. In another embodiment, the sensor system determines a distance to the target 16. This information may then be communicated to the controller 18.

Once the rough alignment target 16 is located the arm 14 can be extended out to a work cassette 20 on the work station 16. A fine alignment target 22 is placed on the work station 16. The sensor system 12 detects the fine alignment target 22. By having multiple target zone (plurality of target zones) on the alignment target 22 the sensor system can determine a fine range, a fine angle and fine height. In addition, the plane of the fine alignment sensor can be determined. This information is the communicated to the robot controller 18.

In one embodiment, the rough alignment targets 16 are found using a spiral search. In another embodiment, the robot has already been programmed with the rough alignment of the work stations and the rough alignment targets are not required. In yet another embodiment the sensor system is placed on the work station where the fine target 22 is shown. The end effector of the robot arm then holds the fine alignment target 22. This variation can be used to determine if the end effector is drooping.

The sensor system can be any non-contact sensor system, such as optical, capacitive, inductive, sonic. Presently, optical sensors are used. An optical beam is shined on the target and the reflection is detected by an optical sensor. The targets are reflectors based on the sensor technology. Distance to the targets can be determined in a number of ways. For instance, the return energy from the target can be correlated to a distance.

The communication system between the sensor system 12 and the robot controller can be a RF or other wireless link. In one embodiment the communication channel is hard wired and a standard processor to processor protocol is used.

Figure 2:
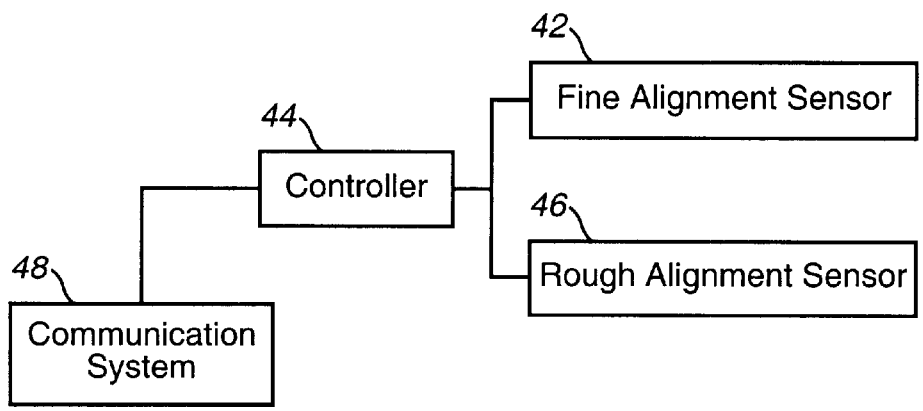
FIG. 2 is a block diagram of a sensor system used in a robot alignment system in accordance with one embodiment of the invention.

FIG. 2 is a block diagram of a sensor system 40 used in a robot alignment system in accordance with one embodiment of the invention. The sensor system 40 has a fine alignment sensor 42. The fine alignment sensor 42 is connected to a controller 44. A rough alignment sensor 46 is also connected to the controller 44. The controller 44 is connected to a communication system 48. In one embodiment the fine alignment sensor and the rough alignment sensor are combined in a single sensor.

Figure 3:
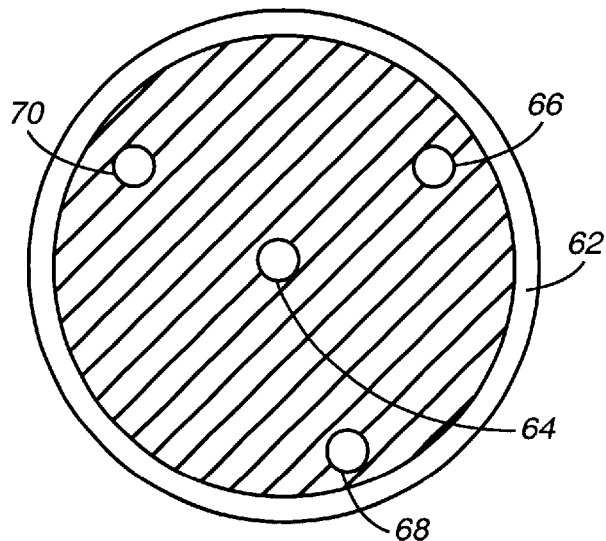
FIG. 3 is a fine alignment target used in a robot alignment system in accordance with one embodiment of the invention.

FIG. 3 is a fine alignment target 60 used in a robot alignment system in accordance with one embodiment of the invention. The fine alignment target 60 has essentially the same shape as a semiconductor wafer. An outer ring 62 is reflective. The outer ring 62 allows the sensor to know that it has encountered the fine alignment target 60. Note that the fine alignment target will be described with respect to an optical sensing system, those skilled in the art would know how to modify the target 60 for other sensor systems such as inductive, capacitive or sonic sensors. Inside the ring 62 are four reflective target zones 64, 66, 68, 70. The target zone 64 defines the center of the fine alignment target for the robot. The outer target zones 66, 68, 70 may be used to determine the plane of the fine alignment target 60. The height (fine height) is determined for each of the zones 66, 68, 70. This information with the X-Y (R,θ) position can be used to define the plane of the fine alignment target.

Figure 4:
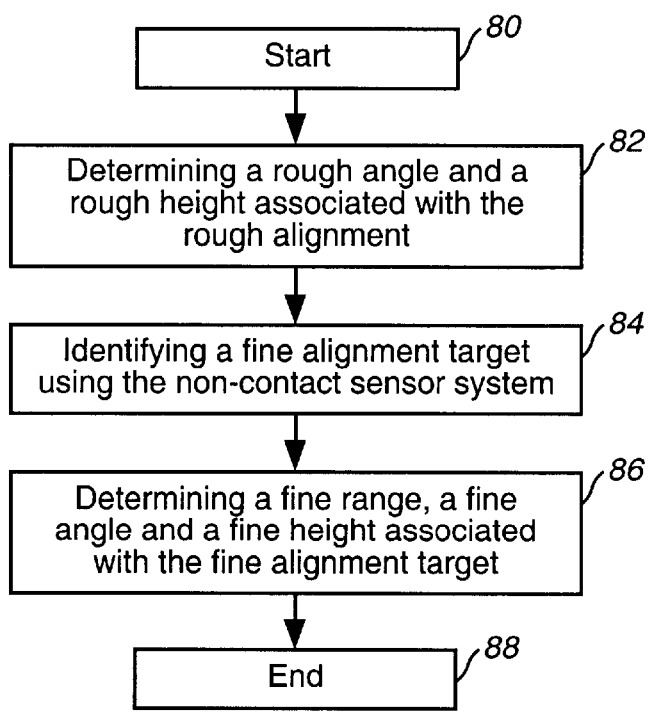
FIG. 4 is a flow chart of the steps used in a method of aligning a robot arm in accordance with one embodiment of the invention.

FIG. 4 is a flow chart of the steps used in a method of aligning a robot arm in accordance with one embodiment of the invention. The process starts, step 80, by determining a rough angle and a rough height associated with the rough alignment at step 82. A fine alignment target is identified using the non-contact sensor system at step 84. At step 86 a fine range, fine angle and a fine height associated with the fine alignment target is determined which ends the process at step 88. The plane of the fine alignment target may also be determined. In one embodiment, the fine alignment target is attached to an end effector of the robot arm. The fine alignment sensor is then placed on the work station. In another embodiment, the fine alignment target is placed on a work station. In one embodiment a spiral search is performed for the rough alignment target. A position message is transmitted to the controller of the robot arm once the fine alignment target has been measured.

There has been described a robot alignment system and method that provides a standard robot setup procedure that is fast, easy, accurate and can address issues such as dynamic path concerns.

The methods described herein can be implemented as computer-readable instructions stored on a computer-readable storage medium that when executed by a computer will perform the methods described herein.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A robot alignment system, comprising:
   a sensor system designed to attach to an end effector of a robot arm;
   a rough alignment target attached to a work station to be sensed by the sensor system; and
   a fine alignment target placed on a work surface of the work station to be sensed by the sensor system.

2. The system of claim 1, wherein the sensor system has a rough alignment sensor and a fine alignment sensor.

3. The system of claim 2, wherein the first rough alignment sensor determines an angle and a height of the rough alignment target.

4. The system of claim 3, wherein the first rough alignment sensor determines a range to the rough alignment target.

5. The system of claim 2, wherein the fine alignment sensor determines a fine range, a fine angle and a fine height to the fine sensor.

6. The system of claim 5, wherein the fine alignment sensor determines a plane of the fine alignment target.

7. The system of claim 1, wherein the sensor system is in communication with a robot controller.

8. The system of claim 1, wherein the rough alignment target is a reflector.

9. The system of claim 1, wherein the fine alignment target is a disk with a plurality of target zones.

10. A method of aligning a robot arm, comprising the steps of:
    (a) determining a rough angle and a rough height associated with the rough alignment;
    (b) identifying a fine alignment target using the non-contact sensor system; and
    (c) determining a fine range, a fine angle and a fine height associated with the fine alignment target.

11. The method of claim 10, further including the step of:
    (d) determining a plane of the fine alignment target.

12. The method of claim 10, wherein step (a) further includes the step of:
    (a1) attaching the fine alignment target to an end effector of the robot arm.

13. The method of claim 10, wherein step (a) further includes the step of:
    (a1) placing the fine alignment target on a work station.

14. The method of claim 10, wherein step (a) further includes the step of:
    (a1) placing the non-contact sensor on a work station.

15. The method of claim 10, wherein step (a) further includes the step of:
    (a1) performing a spiral search for a rough alignment target.

16. The method of claim 10, further including the step of:
    (d) transmitting a position message to a controller of the robot arm.

17. A robot alignment system comprising:
    a non-contact sensor system designed to attach to an end effector of a robot arm;
    a communication system transmitting messages from the non-contact sensor system to a robot controller; and
    a target for being sensed by the non-contact sensor system wherein the target includes a rough alignment target.

18. The system of claim 17, wherein the target is a fine alignment target.

19. The system of claim 18, wherein the fine alignment target includes a plurality of target zones.

* * * * *